US012687783B2

(12) United States Patent     (10) Patent No.:   US 12,687,783 B2
Fu et al.                   (45) Date of Patent:      Jul. 21, 2026

(54) IMMERSION LIQUID SUPPLY SYSTEM AND IMMERSION LIQUID FLOW FIELD REMOVAL METHOD THEREFOR

(71) Applicant: ZHEJIANG CHEER TECHNOLOGY CO., LTD., Hangzhou (CN)

(72) Inventors: Xin Fu, Hangzhou (CN); Yiwen Zhao, Hangzhou (CN); Min Wu, Hangzhou (CN); Ning Xu, Hangzhou (CN); Wenyu Chen, Hangzhou (CN)

(73) Assignee: ZHEJIANG CHEER TECHNOLOGY CO., LTD., Hangzhou (CN)

( * ) Notice: Subject to any disclaimer, the term of this patent is extended or adjusted under 35 U.S.C. 154(b) by 266 days.

(21) Appl. No.: 18/266,914

(22) PCT Filed: Dec. 29, 2020

(86) PCT No.: PCT/CN2020/140554
§ 371 (c)(1),
(2) Date: Jun. 13, 2023

(87) PCT Pub. No.: WO2022/126748
PCT Pub. Date: Jun. 23, 2022

(65) Prior Publication Data
US 2024/0219841 A1     Jul. 4, 2024

(30) Foreign Application Priority Data
Dec. 18, 2020   (CN) .......................... 202011507502.5

(51) Int. Cl.
*G03F 7/20*         (2006.01)
*G03F 7/00*         (2006.01)

(52) U.S. Cl.
CPC ........ *G03F 7/2041* (2013.01); *G03F 7/70341* (2013.01); *G03F 7/70916* (2013.01)

(58) Field of Classification Search
CPC . G03F 7/2041; G03F 7/70341; G03F 7/70916
See application file for complete search history.

(56) References Cited

U.S. PATENT DOCUMENTS 7,480,029 B2 *   1/2009   Hara ................... G03F 7/70341
                                          355/53
7,508,490 B2 *   3/2009   Nagasaka ........... G03F 7/70883
                                          355/53

(Continued)

FOREIGN PATENT DOCUMENTS

CN       101430508      5/2009
CN       104624430      5/2015

*Primary Examiner* — William M McCalister
(74) *Attorney, Agent, or Firm* — Jiwen Chen; Joywin IP Law PLLC

(57)             ABSTRACT

Disclosed are an immersion liquid supply system and an immersion flow field removal method thereof. The immersion liquid supply system comprises an immersion liquid supply source, a liquid supply valve and an immersion liquid suction assembly, wherein the liquid supply valve is connected to a main liquid injection port of an immersion liquid supply device by means of a tail end liquid supply flow path, and the immersion liquid suction assembly and the tail end liquid supply flow path form a fluid connection; once the liquid supply valve is closed, the immersion liquid suction assembly exerts a suction effect on residual immersion liquid in the tail end liquid supply flow path, so that the residual immersion liquid is kept in the tail end liquid supply flow path under the action of atmospheric pressure, or the residual liquid is discharged through the tail end liquid supply flow path, thereby preventing contamination and erosion caused by the leakage of the residual immersion liquid from the main liquid injection port to a lithography (Continued)

apparatus component, or further preventing the residual immersion liquid from contaminating and eroding the tail end liquid supply flow path and an immersion liquid supply recovery device. The amount of immersion liquid accumulated in the tail end liquid supply flow path is effectively reduced once an immersion flow field is removed to mitigate the contamination and erosion of the immersion liquid to the lithography apparatus component.

5 Claims, 4 Drawing Sheets

(56)                 References Cited

U.S. PATENT DOCUMENTS

| | | | | |
|---|---|---|---|---|
| 7,589,820 | B2 * | 9/2009 | Nei | G03F 7/707 |
| | | | | 355/72 |
| 8,564,757 | B2 * | 10/2013 | Jansen | G03B 27/52 |
| | | | | 355/53 |
| 8,753,097 | B2 * | 6/2014 | Cedrone | B01D 39/2075 |
| | | | | 137/884 |
| 8,760,616 | B2 * | 6/2014 | Kaneko | G03F 7/7095 |
| | | | | 355/53 |
| 2004/0160582 | A1 * | 8/2004 | Lof | G03F 7/7085 |
| | | | | 355/75 |
| 2005/0094116 | A1 * | 5/2005 | Flagello | G03F 7/70966 |
| | | | | 355/53 |
| 2005/0219499 | A1 * | 10/2005 | Maria Zaal | G03F 7/70341 |
| | | | | 355/75 |
| 2005/0237501 | A1 * | 10/2005 | Furukawa | G03F 7/70341 |
| | | | | 355/53 |
| 2007/0104586 | A1 * | 5/2007 | Cedrone | F04B 13/00 |
| | | | | 417/26 |
| 2007/0242243 | A1 * | 10/2007 | Kemper | G03F 7/2041 |
| | | | | 355/53 |
| 2010/0060868 | A1 * | 3/2010 | Tanasa | G03F 7/70341 |
| | | | | 355/53 |
| 2012/0128505 | A1 * | 5/2012 | Braggin | F04D 13/06 |
| | | | | 417/1 |
| 2013/0038854 | A1 * | 2/2013 | Kunnen | G03F 7/70875 |
| | | | | 355/73 |

* cited by examiner (a)                                     (b)

IMMERSION LIQUID SUPPLY SYSTEM AND IMMERSION LIQUID FLOW FIELD REMOVAL METHOD THEREFOR

This is a U.S. national stage application of PCT Application No. PCT/CN2020/140554 under 35 U.S.C. 371, filed Dec. 29, 2020 in Chinese, claiming priority of Chinese Application No. 202011507502.5, filed Dec. 18, 2020, all of which are hereby incorporated by reference.

TECHNICAL FIELD

The present disclosure relates to an immersion liquid system, in particular to an immersion liquid supply system used in an immersion lithography apparatus and an immersion flow field removal method.

BACKGROUND TECHNOLOGY

A lithography apparatus, which is one of the core equipment for manufacturing very large scale integrated circuits, may precisely project a circuit pattern on a mask onto a photoresist-coated substrate using an optical system and modify the photoresist by exposure, thereby leaving circuit pattern information on the substrate. It includes a laser light source, a projection objective lens system, a projection mask containing a circuit pattern, and a substrate coated with photosensitive photoresist.

Compared with a dry lithography apparatus with gas as an intermediate medium, an immersion lithography apparatus fills a certain high-refractive-index liquid between a last projection objective lens and a substrate, and increases the Numerical Aperture (NA) of the projection objective lens by increasing the refractive index (n) of the gap liquid medium, thereby improving the resolution and focal depth of the lithography apparatus. In existing mainstream lithography technologies in the relevant art, immersion lithography is widely used because of its good inheritance relative to the early dry lithography. For the filling of immersion liquid, a solution which is widely used at present is partial immersion, i.e., the liquid is confined in a partial region between the lower surface of the last projection objective lens and the upper surface of the substrate using an immersion liquid supply and recovery apparatus. Maintaining the optical consistency and transparency of the immersion liquid in an exposure area is also the key to ensure the quality of immersion lithography exposure. Therefore, in the relevant art, the immersion flow field is usually updated in real time through liquid injection and recovery, and photochemical pollutants, local heat, micro-nano bubbles and the like are timely brought away from a core exposure area, so that the high purity and uniformity of the immersion liquid are ensured.

As shown in FIG. 1 and FIG. 2, in an immersion lithography apparatus, a projection objective lens system has a terminal objective lens 1 closest to a substrate 2, and the terminal objective lens 1 and the substrate 2 form a first gap 11 therebetween; an immersion liquid supply and recovery apparatus 3 is disposed around the terminal objective lens 1, and the immersion liquid supply and recovery apparatus 3 provides immersion liquid LQ into the first gap 11, and the immersion liquid supply and recovery apparatus 3 has a central through hole 31 for passing an exposure laser beam from the terminal objective lens 1; after passing through the terminal objective lens 1, the exposure laser beam carrying circuit pattern information enters the immersion liquid LQ and is projected onto the substrate 2 after passing through the immersion liquid LQ; for the commonly used exposure laser beam with the wavelength of 193 nm in the immersion lithography apparatus, the immersion liquid LQ can be ultrapure water, and the refractive index of the ultrapure water for 193 nm laser is larger than that of air, so compared with a dry lithography apparatus, the exposure laser beam of the immersion lithography apparatus may be converged into an exposure target area with a smaller scale after passing through the terminal objective lens 1 and the immersion liquid LQ, so that a circuit pattern with a smaller scale is formed on a substrate, and the exposure resolution of the lithography apparatus is improved. In order to avoid that the immersion liquid supply and recovery apparatus 3 transmits vibration and thermal disturbance to the terminal objective lens 1 to disturb its optical properties, the immersion liquid supply and recovery apparatus 3 is disposed not to contact the terminal objective lens 1, so that a second gap 12 is formed between the terminal objective lens 1 and the immersion liquid supply and recovery apparatus 3. For the existing immersion lithography apparatus, the substrate 2 is moved relative to the terminal objective lens 1 in the exposure process according to the scan-and-step principle, so that the exposure laser beam projects a single circuit pattern into a single target area of the substrate 2 in a scanning manner, and projects the same circuit pattern into a plurality of target areas of the substrate 2 in a step-by-step manner; since the substrate 2 may move relative to the terminal objective lens 1 and the immersion liquid supply and recovery apparatus 3 is stationary relative to the terminal objective lens 1, the substrate 2 may move relative to the immersion liquid supply and recovery apparatus 3, and a third gap 13 exists between the substrate 2 and the immersion liquid supply and recovery apparatus 3.

Because the laser beam may heat the immersion liquid LQ in the exposure process, photochemical reaction of the photoresist on the substrate 2 may generate pollutants to be released into the immersion liquid LQ, the change of the temperature and cleanliness of the immersion liquid LQ will lead to the change of its optical properties, therefore, the immersion liquid supply and recovery apparatus 3 is disposed to drive the immersion liquid LQ to continuously flow and update to maintain its temperature and cleanliness, specifically, the immersion liquid supply and recovery apparatus 3 is provided with a main liquid injection port 4 facing the second gap 12, and an immersion liquid supply system LS is used to supply the immersion liquid LQ to the second gap 12 through the main liquid injection port 4; the immersion liquid supply and recovery apparatus 3 is provided with a main extraction opening 5 facing the second gap 12 and located on the opposite side of the main liquid injection port 4, and a main extraction system VM is used to extract the immersion liquid LQ through the main extraction opening 5; most of the immersion liquid LQ flows into the second gap 12 from the main liquid injection port 4, and then flows into the first gap 11, and then the immersion liquid in the first gap 11 and the second gap 12 is extracted by the main extraction opening 5; part of the immersion liquid LQ may flow into the third gap 13, in order to prevent a large amount of immersion liquid LQ from remaining on the surface of the substrate 2, resulting in the formation of lithography defects of the substrate 2, and to avoid damage caused by the immersion liquid LQ wetting other components, the immersion liquid supply and recovery apparatus 3 is provided with a scaling extraction opening 6 on the surface facing the substrate 2, the sealing extraction opening 6 may be a circle of evenly distributed small holes or an annular gap, and a scaling extraction system VC is used to extract the immersion liquid LQ in the third gap 13 through the sealing extraction opening 6. Since the substrate 2 may pull the immersion liquid LQ during the scanning and stepping movement, in order to prevent the substrate 2 from excessively pulling the immersion liquid LQ during high-speed movement to cause the immersion liquid LQ to be out of the constraint of the sealing extraction opening 6, a gas scaling opening 7 is disposed on the radial direction outer side of the sealing extraction opening 6 in the immersion liquid supply and recovery apparatus 3, a gas supply system AS is used to supply gas flow to the third gap 13 through the gas sealing opening 7, under the action of increasing the pressure and purging of the gas flow, the constraint ability of the sealing extraction opening 6 to the immersion liquid LQ is enhanced. The main extraction opening 5 and the scaling extraction opening 6 completely extract the immersion liquid LQ, a meniscus 20 is formed between the immersion liquid LQ and the peripheral gas, and the immersion liquid space surrounded by the meniscus 20 is the immersion flow field.

When the immersion lithography apparatus needs to be shut down and the immersion flow field is removed, it is conventional practice to shut down the immersion liquid supply system LS while continuing to keep the main extraction system VM and the sealing extraction system VC started until the immersion liquid LQ in the first gap 11, the second gap 12 and the third gaps 13 is completely extracted, thereby realizing removal of the immersion flow field.

As shown in FIG. 3, the immersion liquid supply system includes an immersion liquid supply source LSS and a liquid supply valve 41, the liquid supply valve controls the on/off of a flow path between the immersion liquid supply source LSS and the main liquid injection port 4, and the act of shutting down the immersion liquid supply system during withdrawal of the immersion flow field includes closing the liquid supply valve 41. A tail end liquid supply flow path 42 with a certain length is disposed between the liquid supply valve 41 and the main liquid injection port 4; once the liquid supply valve 41 is closed, the tail end liquid supply flow path 42 forms a section of a single-end open accommodation cavity, and due to the effect of ambient air pressure, immersion liquid in the tail end liquid supply flow path 42 cannot be completely discharged; the immersion liquid accumulated in the tail end liquid supply flow path 42 may increase the risk of bacterial growth and erode the immersion liquid supply and recovery apparatus 3 to a certain extent, which causes the flow path of the immersion liquid supply and recovery apparatus 3 to be contaminated and is not beneficial to maintaining the cleanliness of the lithography apparatus; in addition, the immersion liquid accumulated in the tail end liquid supply flow path 42 may leak out from the main liquid injection port 4 uncontrollably under the influence of ambient air pressure fluctuation and the like, and the leaked immersion liquid may adhere to the terminal objective lens 1, the substrate 2 or other devices of the lithography apparatus, thereby causing contamination and erosion to components of the lithography apparatus.

Since the space near the immersion liquid supply and recovery apparatus 3 is generally small, the liquid supply valve 41 is generally disposed at a position far away from the main liquid injection port 4, so that the length of the tail end liquid supply flow path 42 is large, and a large amount of immersion liquid may be stored; moreover, in practice, the installation of the immersion liquid supply system LS is often constrained by the spatial arrangement, and may be disposed at a position higher than the immersion liquid supply and recovery apparatus 3, typically, the position of the liquid supply valve 41 is higher than that of the main recovery opening 4 by more than 1.5 m, and the immersion liquid accumulated in the tail end liquid supply flow path 42 is more prone to leak out of the main liquid injection port 4 under the influence of gravity; and the two factors exacerbate the problem of contamination of the components of the lithography apparatus caused by accumulated immersion liquid.

Therefore, it is expected to reduce the amount of immersion liquid accumulated in the tail end liquid supply flow path 42 once the immersion flow field is removed.

SUMMARY OF THE INVENTION

In order to overcome the current situation that for an existing immersion lithography apparatus, in the process of removing an immersion flow field of an immersion liquid supply system, it is easy to cause the erosion of a flow path and increase the risk of bacterial growth due to the factor of immersion liquid in a tail end liquid supply flow path, which is not beneficial to maintaining the cleanliness of the lithography apparatus and easily causes contamination to components of the lithography apparatus, the present disclosure provides an immersion liquid supply system and an immersion flow field removal method thereof for reducing the immersion liquid accumulated in the tail end liquid supply flow path once the immersion flow field is removed, and alleviating the contamination and erosion of the immersion liquid to the components of the lithography apparatus.

To solve the above technical problems, the present disclosure adopts the following specific technical solution: an immersion liquid supply system includes an immersion liquid supply source and a liquid supply valve, and is characterized by further including an immersion liquid suction assembly, the liquid supply valve is connected to a main liquid injection port of an immersion liquid supply apparatus through a tail end liquid supply flow path, and the immersion liquid suction assembly and the tail end liquid supply flow path form a fluid connection. The immersion liquid suction assembly exerts a suction effect on residual immersion liquid in the tail end liquid supply flow path, so that the residual immersion liquid of the tail end liquid supply flow path is kept in the tail end liquid supply flow path under the action of atmospheric pressure, or the residual liquid is discharged through the tail end liquid supply flow path. With the adoption of the immersion liquid supply system and an immersion flow field removal method, once the liquid supply valve is closed, the immersion liquid suction assembly exerts a suction effect on residual immersion liquid in the tail end liquid supply flow path, so that the residual immersion liquid is kept in the tail end liquid supply flow path under the action of atmospheric pressure, or the residual liquid is discharged through the tail end liquid supply flow path, thereby preventing contamination and erosion caused by the leakage of the residual immersion liquid from the main liquid injection port to the components of the lithography apparatus, or further preventing the residual immersion liquid from contaminating and eroding the tail end liquid supply flow path and an immersion liquid supply and recovery apparatus. The immersion liquid, which is accumulated in the tail end liquid supply flow path once the immersion flow field is removed, is reduced, and contamination and erosion to the components of the lithography apparatus are alleviated.

Preferably, the immersion liquid suction assembly is a suck-back valve, which is disposed on the tail end liquid supply flow path; once closing the liquid supply valve, the suck-back valve provides certain suction force for the immersion liquid in the tail end liquid supply flow path, so that the immersion liquid is kept in the tail end liquid supply flow path under the action of ambient air pressure. By improving the effectiveness and reliability of adsorption and retention of the immersion liquid suction assembly for the immersion liquid in the tail end liquid supply flow path, the immersion liquid accumulated in the tail end liquid supply flow path is prevented from leaking out the main liquid injection port once the immersion flow field is removed, and contamination and erosion of the immersion liquid to the components of the lithography apparatus are alleviated.

Preferably, the immersion liquid suction assembly includes a liquid discharge bypass, which is in communication with the tail end liquid supply flow path; and a vacuum source and a liquid discharge valve are disposed on the liquid discharge bypass. Once the immersion liquid supply system stops supplying the immersion liquid, the immersion liquid in the tail end liquid supply flow path is discharged through the liquid discharge bypass. By improving the simplicity, reliability and effectiveness of suction and discharging of the immersion liquid suction assembly for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the immersion liquid suction assembly includes a liquid discharge bypass, which is in communication with the tail end liquid supply flow path; the liquid discharge bypass is connected to the sealing extraction system; and a liquid discharge valve are disposed on the liquid discharge bypass. Once the immersion liquid supply system stops supplying the immersion liquid, the sealing extraction system is used to provide power to suck the immersion liquid in the tail end liquid supply flow path, so that the immersion liquid is discharged through the liquid discharge bypass. By improving the simplicity, reliability and effectiveness of suction and discharging of the immersion liquid suction assembly for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the immersion liquid suction assembly includes a liquid discharge opening, a sealing extraction system and a sealing extraction flow path inside the immersion liquid supply and recovery apparatus, the sealing extraction opening is connected to the sealing extraction system by the sealing extraction flow path inside the immersion liquid supply and recovery apparatus, the tail end liquid supply flow path and the sealing extraction flow path are connected in a communication way through the liquid discharge opening inside the immersion liquid supply and recovery apparatus; and once the immersion liquid supply system stops supplying the immersion liquid, the immersion liquid accumulated in the tail end liquid supply flow path flows into the sealing extraction flow path through the tail end liquid supply flow path and liquid discharge opening to be extracted. By improving the simplicity, reliability and effectiveness of suction and discharging of the immersion liquid suction assembly for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the immersion liquid suction assembly includes a liquid discharge bypass, a plurality of scaling extraction openings, a sealing extraction cavity and a sealing extraction system, the plurality of sealing extraction openings are connected to the sealing extraction cavity inside the immersion liquid supply and recovery apparatus, the scaling extraction cavity is connected to the sealing extraction system through a sealing extraction flow path, a liquid resisting groove is disposed inside the immersion liquid supply and recovery apparatus and located at the tail end liquid supply flow path, and on the plane perpendicular to the flow direction of the immersion liquid, the projection of the liquid resisting groove completely covers the projection of the tail end liquid supply flow path; and a liquid discharge opening is disposed as a liquid discharge bypass, the liquid discharge opening is disposed on the lower surface of the liquid resisting groove, and the liquid discharge opening is connected to the liquid resisting groove and the sealing extraction cavity in a communication way. By improving the simplicity, reliability and effectiveness of suction and discharging of the immersion liquid suction assembly for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the immersion liquid suction assembly includes a liquid discharge bypass and a liquid supply valve, the liquid supply valve has at least two working positions and at least three flow openings, one of the flow openings is connected to a gas source, and the liquid discharge bypass is connected to the tail end liquid supply flow path; once the immersion liquid supply system stops supplying the immersion liquid, the internal flow path of the liquid supply valve is located at the second working position to allow communication between the gas source and the tail end liquid supply flow path, and block the immersion liquid supply source. By eliminating any closed opening along the tail end liquid supply flow path in the liquid discharge process, improving the simplicity, reliability and effectiveness of the liquid supply valve for suction and discharging control of the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the connection point between the liquid discharge bypass and the tail end liquid supply flow path is located at the lowest position of the tail end liquid supply flow path. By improving the simplicity, reliability and effectiveness of suction and discharging of the liquid discharge bypass for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the cross-sectional area of the liquid discharge opening is $\frac{1}{10}$ to $\frac{1}{2}$ of the cross-sectional area of the main liquid injection port in the immersion liquid supply system. By improving the simplicity, reliability and effectiveness of suction and discharging of the liquid discharge opening for the immersion liquid in the tail end liquid supply flow path, the immersion liquid, which is accumulated in the tail end liquid supply flow path once the immersion flow field is removed, is reduced, and contamination and erosion of the immersion liquid to the components of the lithography apparatus are alleviated.

Preferably, the pressure of the gas source is greater than or equal to the air pressure of the environment in which the immersion liquid supply system is located. Air flow is provided to assist in removing the immersion liquid from the tail end liquid supply flow path to improve the reliability and effectiveness of suction retention or discharging of the immersion liquid in the tail end liquid supply flow path, Another inventive objective of the present disclosure is to provide an immersion flow field removal method, which includes the following removal steps.

A1, a main extraction system and a sealing extraction system are kept on, and a liquid supply valve is operated to cut off a flow path between an immersion liquid supply source and a main liquid injection port.

A2, the immersion liquid suction assembly described in one of the above technical solutions is operated to suction or extract an immersion liquid from the tail end liquid supply flow path, so as to cause the residual immersion liquid to be retained in the tail end liquid supply flow path under the action of atmospheric pressure, or to cause the residual liquid to be discharged through the tail end liquid supply flow path, wherein the operation for the immersion liquid suction assembly is to use the suction function of the suck-back valve, or to extract an immersion liquid from the tail end liquid supply flow path by opening the liquid discharge valve and using the liquid discharge bypass.

A3, the main extraction system and the sealing extraction system are turned off.

The immersion liquid, which is accumulated in the tail end liquid supply flow path once the immersion flow field is removed, is reduced, and contamination and erosion to the components of the lithography apparatus are alleviated.

The present disclosure has the beneficial effects that: with the adoption of the immersion liquid supply system and the immersion flow field removal method, once the liquid supply valve of the immersion liquid supply system is closed, the immersion liquid suction assembly exerts a suction effect on residual immersion liquid in the tail end liquid supply flow path, so that the residual immersion liquid is kept in the tail end liquid supply flow path under the action of atmospheric pressure, or the residual liquid is discharged through the tail end liquid supply flow path, thereby preventing contamination and erosion caused by the leakage of the residual immersion liquid from the main liquid injection port to the components of the lithography apparatus, or further preventing the residual immersion liquid from contaminating and eroding the tail end liquid supply flow path and an immersion liquid supply and recovery apparatus.

BRIEF DESCRIPTION OF THE DRAWINGS

The present disclosure will be further described in detail below with reference to the drawings and specific implementation modes.

DETAILED DESCRIPTION OF THE EMBODIMENTS

Embodiment 1

Figure 1:
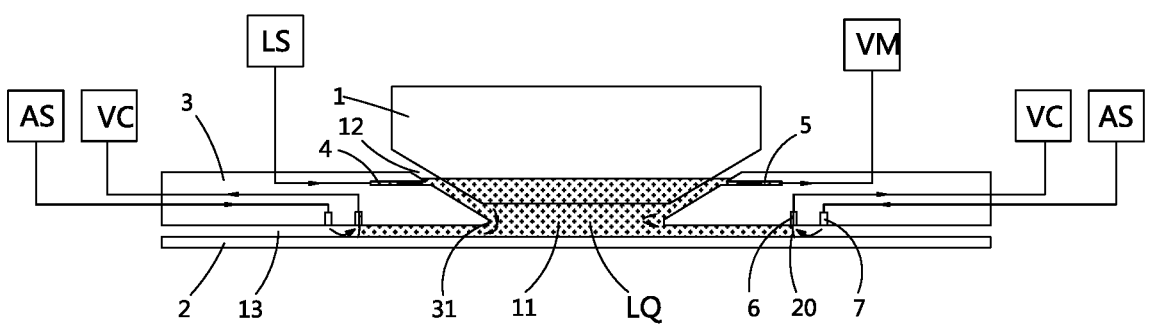
FIG. 1 is a schematic structural diagram of a longitudinal cross-sectional view of an immersion liquid supply and recovery apparatus and an immersion flow field in the relevant art.
Figure 2:
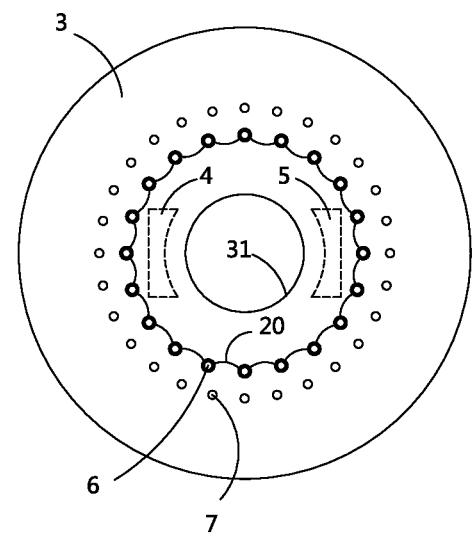
FIG. 2 is a schematic structural diagram of a bottom view of an immersion liquid supply and recovery apparatus in the relevant art.
Figure 3:
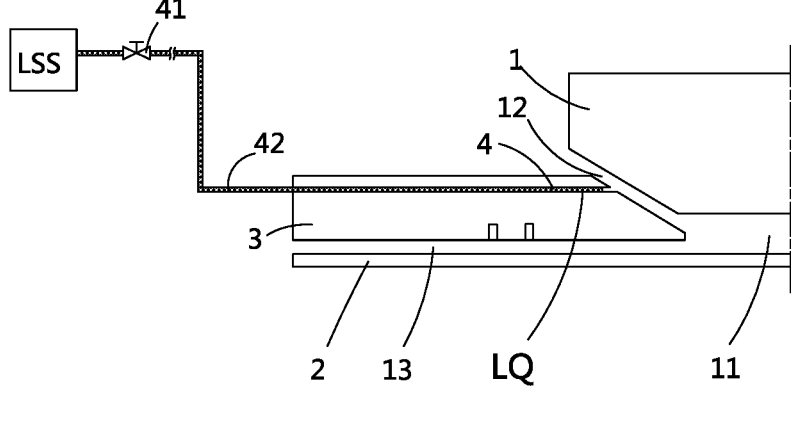
FIG. 3 is a schematic structural diagram of an immersion liquid supply system in the relevant art.
Figure 4:
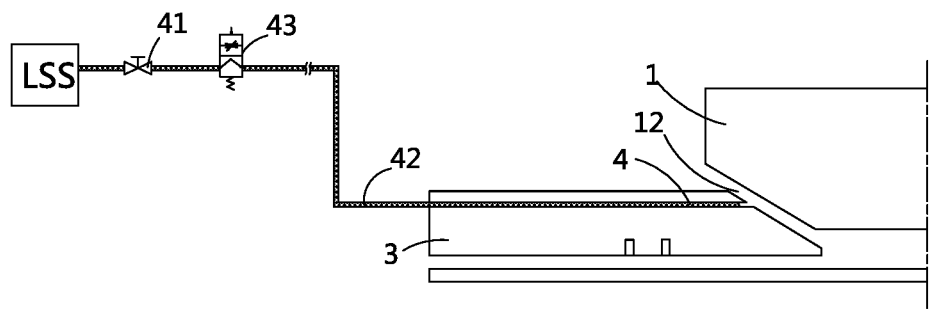
FIG. 4 is a schematic structural diagram of Embodiment 1 of an immersion liquid supply system of the present disclosure.
Figure 5:
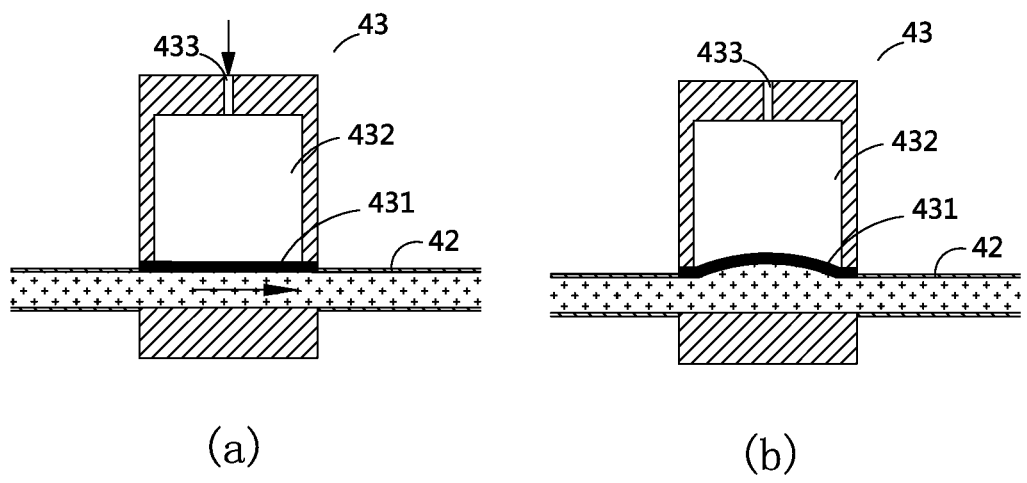
FIG. 5 is a schematic structural diagram of principle of one type of suck-back valve involved in Embodiment 1 of an immersion liquid supply system of the present disclosure.

In embodiments shown in FIGS. 4 and 5, an immersion liquid supply system includes an immersion liquid supply source and a liquid supply valve, and further includes an immersion liquid suction assembly, the liquid supply valve is connected to a main liquid injection port of an immersion liquid supply apparatus by means of a tail end liquid supply flow path, and the immersion liquid suction assembly and the tail end liquid supply flow path form a fluid connection; the immersion liquid suction assembly exerts a suction effect on residual immersion liquid in the tail end liquid supply flow path, so that the residual immersion liquid of the tail end liquid supply flow path is kept in the tail end liquid supply flow path under the action of atmospheric pressure, or the residual liquid is discharged through the tail end liquid supply flow path. The immersion liquid suction assembly is a suck-back valve, which is disposed on the tail end liquid supply flow path; once the liquid supply valve 41 is closed, the suck-back valve 43 provides certain suction force for the immersion liquid in the tail end liquid supply flow path 42, so that the immersion liquid is kept in the tail end liquid supply flow path 42 under the action of ambient air pressure.

As shown in FIG. 4, an immersion liquid supply system includes an immersion liquid supply source LSS and a liquid supply valve 41, the liquid supply valve 41 is connected to a main liquid injection port 4 of an immersion liquid supply apparatus 3 by means of a tail end liquid supply flow path 42; the immersion liquid supply system provides immersion liquid, which is injected into a second gap 12 between a terminal objective lens 1 and the immersion liquid supply and recovery apparatus 3 through the main liquid injection port 4 after flowing through the liquid supply valve 41 and the tail end liquid supply flow path 42; and a suck-back valve 43 disposed on the tail end liquid supply flow path 42 is further included. Once closing the liquid supply valve 41, the suck-back valve 43 provides certain suction force for the immersion liquid in the tail end liquid supply flow path 42, so that the immersion liquid is kept in the tail end liquid supply flow path 42 under the action of ambient air pressure, but cannot leak to other components of a lithography apparatus from the main liquid injection port 4, thereby preventing contamination and erosion to other components of the lithography apparatus.

The suck-back valve 43 may use AMS series products sold by CKD Co., Ltd. The schematic diagram of working principle of one type of suck-back valve 43 is as shown in FIG. 5, the suck-back valve 43 is connected to the tail end liquid supply flow path 42 in series connection form, the inside of the suck-back valve 43 uses an elastic diaphragm 431 as a part of wall of the liquid flow path, the elastic diaphragm 431 is provided with a control cavity 432 relative to the other side of the liquid, and the control cavity 432 is connected to an external control gas source through a control opening 433, as shown in FIG. 5 (*a*), when the liquid in the tail end liquid supply flow path 42 continuously flows, compressed gas is supplied to the control cavity 432 through control opening 433, which causes the elastic diaphragm 431 to deform towards the liquid side; as shown in FIG. 5 (*b*), when the liquid in the tail end liquid supply flow path 42 stops flowing, the supply of compressed gas to the control cavity 432 is stopped, the elastic diaphragm 431 deforms towards the side of the control cavity 432 under the action of elastic force, which increases the volume space in the tail end liquid supply flow path 42 and produces a negative pressure suction effect on the liquid in the tail end liquid supply flow path 42, so that the immersion liquid is kept in the tail end liquid supply flow path 42 under the action of ambient air pressure.

Embodiment 2

Figure 6:
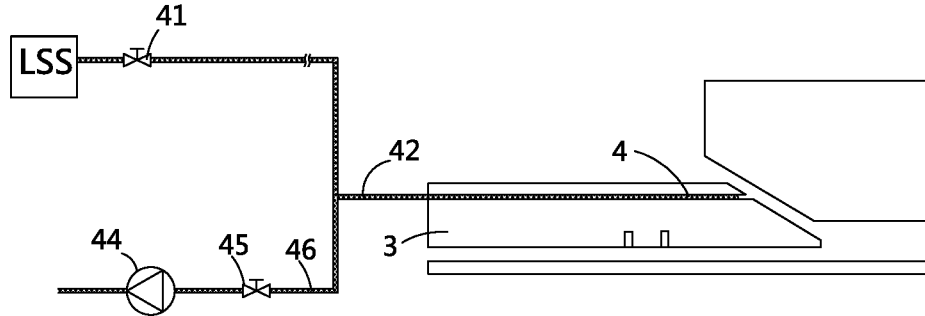
FIG. 6 is a schematic structural diagram of Embodiment 2 of an immersion liquid supply system of the present disclosure.

In the embodiment as shown in FIG. 6, an immersion liquid suction assembly includes a liquid discharge bypass, which is connected to a tail end liquid supply flow path; and once the immersion liquid supply system stops supplying immersion liquid, the immersion liquid in the tail end liquid supply flow path 42 is discharged through the liquid discharge bypass 46.

Furthermore, as shown in FIG. 6, the immersion liquid supply system includes an immersion liquid supply source LSS and a liquid supply valve 41, and the liquid supply valve 41 is connected to a main liquid injection port 4 of an immersion liquid supply apparatus 3 by means of a tail end liquid supply flow path 42; the liquid discharge bypass 46 is connected to the tail end liquid supply flow path 42, and a vacuum source 44 and a liquid discharge valve 45 are disposed on the liquid discharge bypass 46; when the immersion liquid supply system continuously supplies immersion liquid, the liquid discharge valve 45 is closed, and the immersion liquid is injected into a second gap 12 between the terminal objective lens 1 and the immersion liquid supply and recovery apparatus 3 through the main liquid injection port 4 after flowing through the liquid supply valve 41 and the tail end liquid supply flow path 42; when the immersion liquid supply system stops supplying immersion liquid, the liquid discharge valve 45 is opened, the vacuum source 44 is started, the vacuum source 44 sucks immersion liquid in the tail end liquid supply flow path 42, so that the immersion liquid is discharged through the liquid discharge bypass 46; and the immersion liquid accumulated in the tail end liquid supply flow path 42 is reduced or even completely eliminated, contamination and erosion to the objective lens of the lithography apparatus, a workpiece table and other components are avoided, and contamination and erosion to the immersion liquid supply and recovery apparatus 3 are also reduced.

Preferably, the connection point between the liquid discharge bypass 46 and the tail end liquid supply flow path 42 is located at the lowest position of the tail end liquid supply flow path; and preferably, the vacuum source 44 and the liquid discharge bypass 46 are located lower than the main liquid injection port 4, so that the immersion liquid is discharged through the tail end liquid supply flow path 42 by gravity assistance. The others are the same as in Embodiment 1.

Embodiment 3

Figure 7:
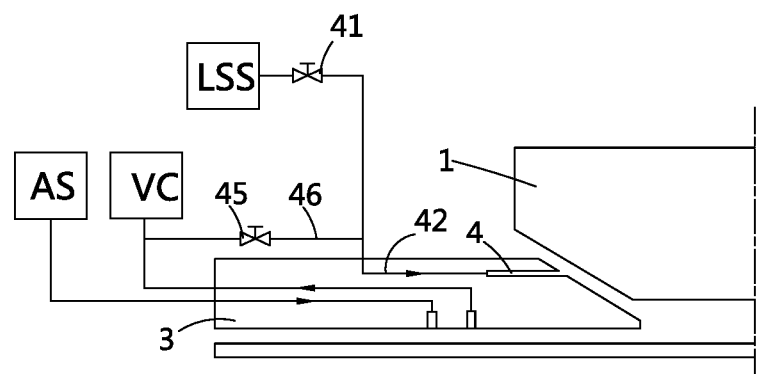
FIG. 7 is a schematic structural diagram of Embodiment 3 of an immersion liquid supply system of the present disclosure.

In the embodiment as shown in FIG. 7, an immersion liquid suction assembly includes a liquid discharge bypass, which is connected to a tail end liquid supply flow path, and the liquid discharge bypass 46 is connected to a sealing extraction system VC; once an immersion liquid supply system stops supplying the immersion liquid, the sealing extraction system VC is used to provide power to suck the immersion liquid in the tail end liquid supply flow path 42, so that the immersion liquid is discharged through the liquid discharge bypass 46. The others are the same as in Embodiment 1 or Embodiment 2.

Furthermore, as shown in FIG. 7, an immersion liquid supply system is provided with a liquid discharge bypass 46, which is connected to a tail end liquid supply flow path 42, the liquid discharge bypass 46 is provided with a liquid discharge valve 45, and the liquid discharge bypass 46 is connected to the sealing extraction system VC; once the immersion liquid supply system stops supplying the immersion liquid, the liquid discharge valve 45 is opened, the sealing extraction system VC is used to provide power to suck the immersion liquid in the tail end liquid supply flow path 42, so that the immersion liquid is discharged through the liquid discharge bypass 46; and other implementation modes are the same as in Embodiment 2. Compared with Embodiment 2, a vacuum source component on the liquid discharge bypass 46 may be reduced in Embodiment 3.

Embodiment 4

Figure 8:
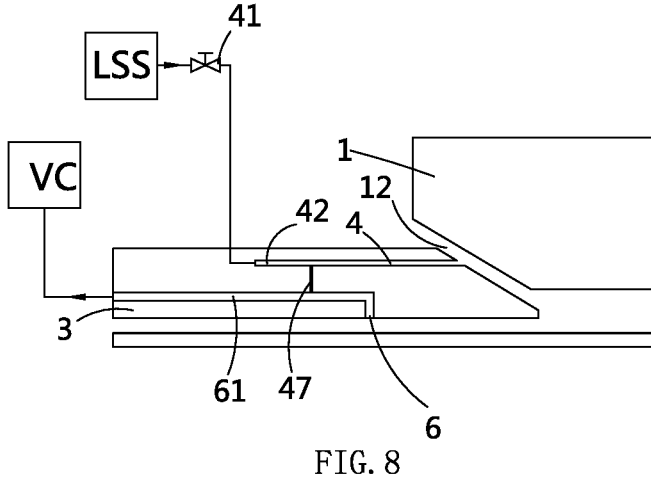
FIG. 8 is a schematic structural diagram of Embodiment 4 of an immersion liquid supply system of the present disclosure.

In the embodiment as shown in FIG. 8, the immersion liquid suction assembly includes a liquid discharge opening 47, a sealing extraction system VC and a sealing extraction flow path 61 inside the immersion liquid supply and recovery apparatus 3, the sealing extraction opening 6 is connected to the sealing extraction system VC by the sealing extraction flow path 61 inside the immersion liquid supply and recovery apparatus 3, the tail end liquid supply flow path 42 and the sealing extraction flow path 61 are connected in a communication way through the liquid discharge opening 47 inside the immersion liquid supply and recovery apparatus 3; and once the immersion liquid supply system stops supplying the immersion liquid, the immersion liquid accumulated in the tail end liquid supply flow path 42 flows into the sealing extraction flow path 61 through the tail end liquid supply flow path 42 and liquid discharge opening 47 to be extracted. The cross-sectional area of the liquid discharge opening 47 is $\frac{1}{10}$ to $\frac{1}{2}$ of the cross-sectional area of the main liquid injection port in the immersion liquid supply system. The liquid discharge bypass is a liquid discharge opening located in the immersion liquid supply and recovery apparatus, and the liquid discharge opening is connected to the tail end liquid supply flow path and the sealing extraction flow path in a communication manner. The others are the same as in Embodiment 1 or Embodiment 2.

Furthermore, as shown in FIG. 8, for the immersion liquid supply system, the sealing extraction opening 6 is connected to the sealing extraction system VC through the sealing extraction flow path 61 inside the immersion liquid supply and recovery apparatus 3, the tail end liquid supply flow path 42 and the sealing extraction flow path 61 are connected in a communication way through the liquid discharge opening 47 inside the immersion liquid supply and recovery apparatus 3; when the immersion liquid supply system continuously supplies immersion liquid, one part of immersion liquid flows into the second gap 12 through the tail end liquid supply flow path 42 and the main liquid injection port 4, the other part of the immersion liquid flows into the scaling extraction flow path 61 through the tail end liquid supply flow path 42 and the liquid discharge opening 47, and then is extracted by the sealing extraction system; when the immersion liquid supply system stops supplying the immersion liquid, the liquid supply valve 41 is closed, the sealing extraction system VC is kept working, and the immersion liquid accumulated in the tail end liquid supply flow path 42 flows into the sealing extraction flow path 61 through the tail end liquid supply flow path 42 and liquid discharge opening 47 to be extracted. Compared with Embodiment 3, in Embodiment 4, the liquid discharge valve is reduced, a machined opening structure is used to replace an external pipeline, which is beneficial to reduce the complexity of a pipeline system and make the space size of the immersion liquid supply system compact.

The liquid discharge opening 47 may be provided as a gap or one or more small holes. Preferably, the cross-sectional area of the liquid discharge opening 47 is set to be smaller than $\frac{1}{2}$ of that of the main liquid injection port 4, so that when the immersion liquid supply system continuously supplies immersion liquid, not too much immersion liquid is discharged and wasted through the liquid discharge opening 47. Preferably, the cross-sectional area of the liquid discharge opening 47 is set to be greater than $\frac{1}{10}$ of that of the main liquid injection port 4, so that the flow resistance of the liquid discharge opening 47 is not too large to resist the immersion liquid in the tail end liquid supply flow path 42 to be smoothly extracted by the sealing extraction system VC.

Embodiment 5

Figure 9:
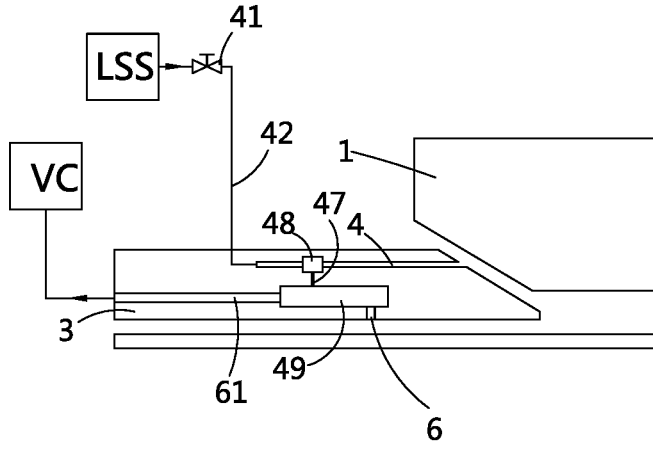
FIG. 9 is a schematic structural diagram of Embodiment 5 of an immersion liquid supply system of the present disclosure.
Figure 10:
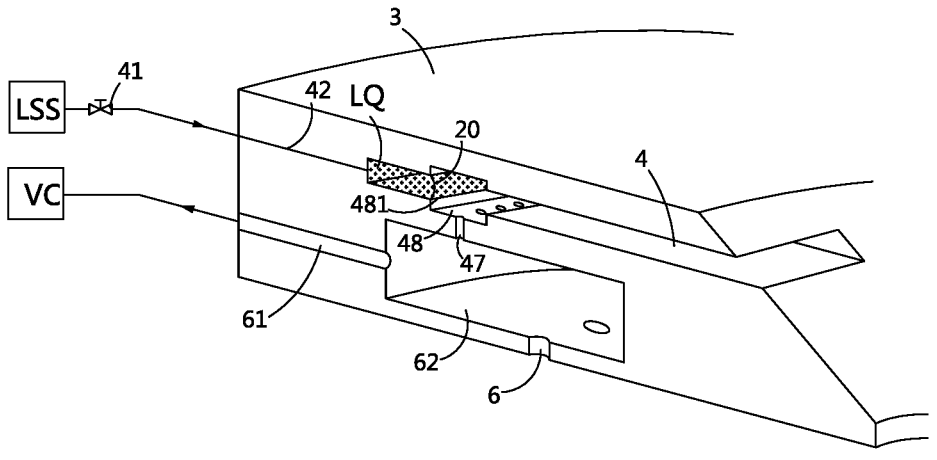
FIG. 10 is an internal schematic structural diagram of Embodiment 5 of an immersion liquid supply system of the present disclosure.

In the embodiments as shown in FIGS. 9 and 10, the immersion liquid suction assembly includes a liquid discharge bypass, a plurality of sealing extraction openings 6, a sealing extraction cavity 62 and a sealing extraction system VC, the plurality of sealing extraction openings 6 are connected to the sealing extraction cavity 62 inside the immersion liquid supply and recovery apparatus 3, the sealing extraction cavity 62 is connected to the sealing extraction system VC through a sealing extraction flow path 61, a liquid resisting groove 48 is disposed inside the immersion liquid supply and recovery apparatus 3 and located at the tail end liquid supply flow path 42, and on the plane perpendicular to the flow direction of the immersion liquid, the projection of the liquid resisting groove completely covers the projection of the tail end liquid supply flow path; and a liquid discharge opening is disposed as a liquid discharge bypass, the liquid discharge opening is disposed on the lower surface of the liquid resisting groove, and the liquid discharge opening is connected to the liquid resisting groove and the sealing extraction cavity in a communication way. The others are the same as in Embodiment 1 or Embodiment 2.

Furthermore, as shown in FIGS. 9 and 10, for an immersion liquid suction assembly, a plurality of sealing extraction openings 6 are connected to the sealing extraction cavity 62 inside the immersion liquid supply and recovery apparatus 3, the sealing extraction cavity 62 is connected to the sealing extraction system VC through a sealing extraction flow path 61, a liquid resisting groove 48 is disposed inside the immersion liquid supply and recovery apparatus 3 and located at the tail end liquid supply flow path 42, and on the plane perpendicular to the flow direction of the immersion liquid, the projection of the liquid resisting groove 48 completely covers the projection of the tail end liquid supply flow path 42, the upper surface of the liquid resisting groove 48 is higher than that of the main liquid injection port 4, the lower surface of the liquid resisting groove 48 is lower than that of the main liquid injection port 4; and a liquid discharge opening 47 is disposed on the lower surface of the liquid resisting groove 48 for being connected to the liquid resisting groove 48 and the sealing extraction cavity 62 in a communication way. Once the immersion liquid supply system stops supplying the immersion liquid, the liquid supply valve 41 is closed, the sealing extraction system VC is kept working, and the immersion liquid accumulated in the tail end liquid supply flow path 42 flows into the sealing extraction cavity 62 through the tail end liquid supply flow path 42 and the sealing extraction opening 47 to be extracted.

Even with the suction and extraction effect of sealing extraction system VC on the immersion liquid, there may still be a small amount of residual immersion liquid in the tail end liquid supply flow path 42, and this part of residual immersion liquid may leak outside the main liquid injection port 4 along the tail end liquid supply flow path 42; in the embodiment, the liquid resisting groove 48 is disposed, the cross-sectional area of the liquid resisting groove 48 is larger than that of the tail end liquid supply flow path 42, when the residual immersion liquid flows through the liquid resisting groove 48, additional energy will be consumed to form resistance to the advance of the immersion liquid due to the expansion of the area of the meniscus of the residual immersion liquid, so as to avoid the leakage of the residual immersion liquid out of the main liquid injection port 4. Preferably, it may be set as that a sharp edge 481 is formed at the junction between the liquid resisting groove 48 and the tail end liquid supply flow path 42, which may further increase the resistance to the advance of the meniscus of the immersion liquid. Therefore, the liquid resisting groove 48 further improves the reliability of avoiding leakage of the immersion liquid accumulated in the tail end liquid supply flow path 42.

Embodiment 6

Figure 11:
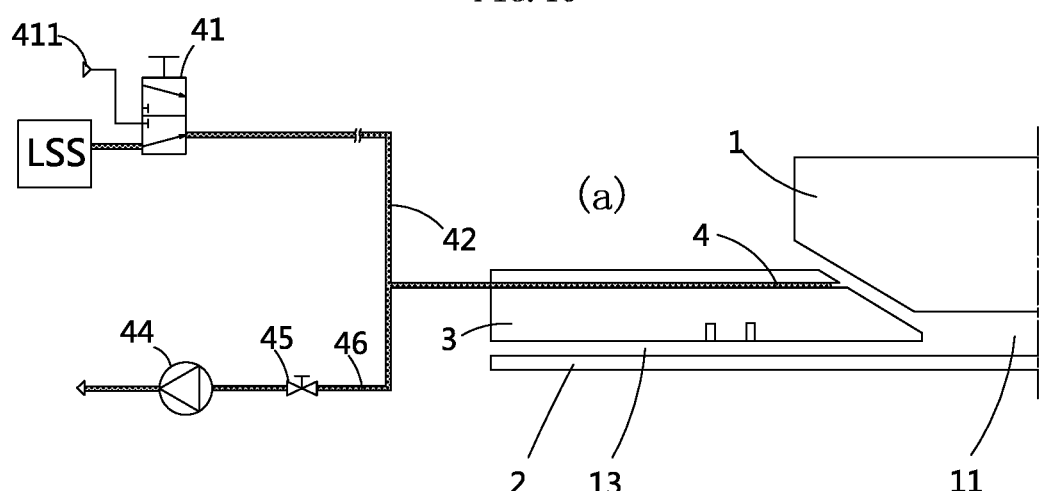
FIG. 11 is a schematic structural diagram of Embodiment 6 of an immersion liquid supply system of the present disclosure.
Figure 11:
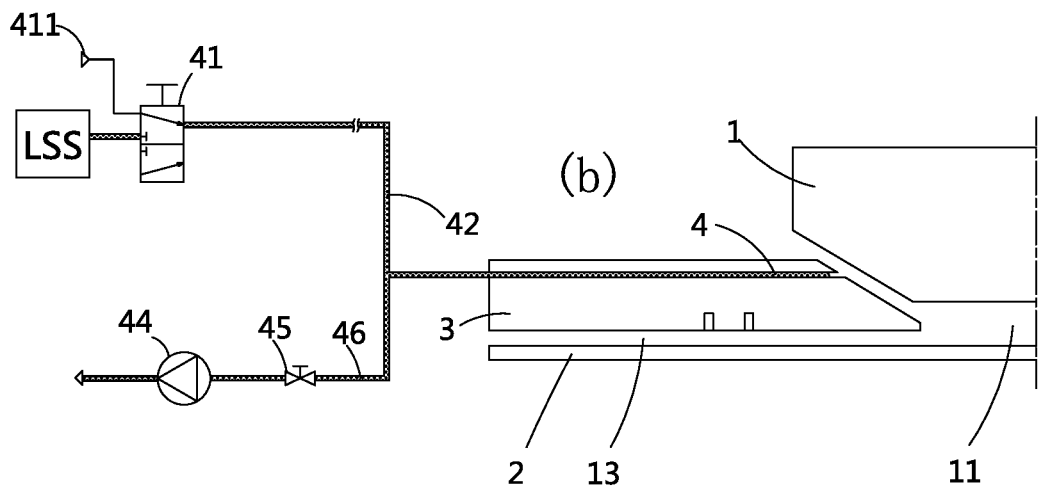

In the embodiment as shown in FIG. 11, the immersion liquid suction assembly includes a liquid discharge bypass and a liquid supply valve, the liquid supply valve 41 has at least two working positions and at least three flow openings, one of the flow openings is connected to a gas source 411, and the liquid discharge bypass is connected to the tail end liquid supply flow path; once the immersion liquid supply system stops supplying the immersion liquid, the internal flow path of the liquid supply valve 41 is located at the second working position to allow communication between the gas source 411 and the tail end liquid supply flow path 42, and block the immersion liquid supply source LSS. The others are the same as in Embodiment 1 or Embodiment 2.

Furthermore, as shown in FIG. 11, for an immersion liquid supply system, the liquid supply valve 41 is a two-position three-way reversing valve; a flow opening of the liquid supply valve 41 is connected to the gas source 411, the gas source 411 may be environmental gas or positive pressure gas source; as shown in FIG. 11 (a), when the immersion liquid supply system continuously supplies immersion liquid, the internal flow path of the liquid supply valve 41 is located at the first working position for allowing communication between the immersion liquid supply source LSS and the tail end liquid supply flow path 42 and blocking the gas source 411, at this time, the immersion liquid provided by the immersion liquid supply source LSS continuously flows into the tail end liquid supply flow path 42; as shown in FIG. 11 (b), when the immersion liquid supply system stops supplying the immersion liquid, the internal flow path of the liquid supply valve 41 is located at the second working position for allowing communication between the gas source 411 and the tail end liquid supply flow path 42 and blocking the immersion liquid supply source LSS. Other implementation modes are the same as any from Embodiment 2 to Embodiment 5.

In the embodiment, the tail end liquid supply flow path 42 communicates with the gas source 411 during liquid discharge, thereby eliminating any closed opening along the tail end liquid supply flow path 42 in the process of liquid discharge, further avoiding the situation that the immersion liquid is bound to the closed opening by ambient air pressure and cannot be pumped out, thus achieving more thorough extraction of the immersion liquid stored in the tail end liquid supply flow path 42. Preferably, the gas source 411 is set as a positive pressure gas source slightly higher than the ambient air pressure, to provide a gas flow with a larger flow rate in the extraction process to assist the extraction of residual immersion liquid.

Embodiment 7

In the embodiments shown in FIGS. 4, 5, 6, 7, 8, 9, 10 and 11, an immersion flow field removal method includes the following steps.

A1, a main extraction system VM and a sealing extraction system VC are turned on, and a liquid supply valve 41 is operated to cut off a flow path between an immersion liquid supply source and a main liquid injection port 4.

A2, the immersion liquid suction assembly of one of Embodiments 1-6 is operated to suction or extract an immersion liquid from the tail end liquid supply flow path 42, so as to cause the residual immersion liquid to be retained in the tail end liquid supply flow path under the action of atmospheric pressure, or to cause the residual liquid to be discharged through the tail end liquid supply flow path, wherein the operation for the immersion liquid suction assembly is to use the suck-back function of the suck-back valve 43, or to extract an immersion liquid from the tail end liquid supply flow path 42 by opening the liquid discharge valve 45 and using the liquid discharge bypass 46.

A3, the main extraction system VM and the sealing extraction system VC are turned off.

In the description of the positional relationship of the present disclosure, orientation or position relationships indicated by terms "inner", "outer", "upper", "lower", "left", "right" and the like are orientation or position relationships shown in the drawings, are adopted not to indicate or imply that indicated apparatus or components must be in specific orientations or structured and operated in specific orientations but only to conveniently and simply describe the embodiments and thus should not be understood as limits to the present disclosure.

The forgoing contents and structures describe the basic principles and main features of the product of the present disclosure and the advantages of the present disclosure, which will be understood by those skilled in the art. The descriptions of the examples and the specification are only the principles of the present disclosure. The present disclosure may have various variations and modifications, which shall fall within the scope claimed for protection in the present disclosure, without departing from the spirit and scope of the present disclosure. The scope claimed for protection in the present disclosure is defined by the attached claims and equivalents thereof.

The invention claimed is:

1. An immersion liquid supply system, comprising an immersion liquid supply source and a liquid supply valve, and characterized by further comprising an immersion liquid suction assembly, wherein the liquid supply valve is connected to a main liquid injection port of an immersion liquid supply apparatus through a tail end liquid supply flow path, and the immersion liquid suction assembly and the tail end liquid supply flow path form a fluid connection, wherein the immersion liquid suction assembly comprises a liquid discharge opening, a sealing extraction system and a sealing extraction flow path inside the immersion liquid supply and recovery apparatus, a sealing extraction opening is connected to the sealing extraction system by the sealing extraction flow path inside the immersion liquid supply and recovery apparatus, and the tail end liquid supply flow path and the sealing extraction flow path are connected in a communication way through the liquid discharge opening inside the immersion liquid supply and recovery apparatus.

2. An immersion liquid supply system, comprising an immersion liquid supply source and a liquid supply valve, and characterized by further comprising an immersion liquid suction assembly, wherein the liquid supply valve is connected to a main liquid injection port of an immersion liquid supply apparatus through a tail end liquid supply flow path, and the immersion liquid suction assembly and the tail end liquid supply flow path form a fluid connection, wherein the immersion liquid suction assembly comprises a liquid discharge bypass, a plurality of sealing extraction openings, a sealing extraction cavity and a sealing extraction system, the plurality of sealing extraction openings are connected to the sealing extraction cavity inside the immersion liquid supply and recovery apparatus, the sealing extraction cavity is connected to the sealing extraction system through a sealing extraction flow path, a liquid resisting groove is disposed inside the immersion liquid supply and recovery apparatus and located at the tail end liquid supply flow path, and on the plane perpendicular to the flow direction of an immersion liquid, the projection of the liquid resisting groove completely covers the projection of the tail end liquid supply flow path; and a liquid discharge opening is disposed as the liquid discharge bypass, the liquid discharge opening is disposed on the lower surface of the liquid resisting groove, and the liquid discharge opening is connected to the liquid resisting groove and the sealing extraction cavity in a communication way.

3. The immersion liquid supply system according to claim 1, wherein the cross-sectional area of the liquid discharge opening is $\frac{1}{10}$ to $\frac{1}{2}$ of the cross-sectional area of the main liquid injection port in the immersion liquid supply system.

4. An immersion flow field removal method, comprising the following removal steps:

A1, keeping a main extraction system and a sealing extraction system on, and operating a liquid supply valve to cut off a flow path between an immersion liquid supply source and a main liquid injection port;

A2, operating the immersion liquid suction assembly according to claim 2 to suction or extract an immersion liquid from the tail end liquid supply flow path, so as to cause the residual immersion liquid to be retained in the tail end liquid supply flow path under the action of atmospheric pressure, or to cause the residual liquid to be discharged through the tail end liquid supply flow path, wherein the operation for the immersion liquid suction assembly is to use the suck-back function of the suck-back valve, or to extract an immersion liquid from the tail end liquid supply flow path by opening the liquid discharge valve and using the liquid discharge bypass; and A3, turning off the main extraction system and the sealing extraction system.

5. An immersion flow field removal method, comprising the following removal steps:

A1, keeping a main extraction system and a sealing extraction system on, and operating a liquid supply valve to cut off a flow path between an immersion liquid supply source and a main liquid injection port;

A2, operating the immersion liquid suction assembly according to claim 2 to suction or extract an immersion liquid from the tail end liquid supply flow path, so as to cause the residual immersion liquid to be retained in the tail end liquid supply flow path under the action of atmospheric pressure, or to cause the residual liquid to be discharged through the tail end liquid supply flow path, wherein the operation for the immersion liquid suction assembly is to use the suck-back function of the suck-back valve, or to extract an immersion liquid from the tail end liquid supply flow path by opening the liquid discharge valve and using the liquid discharge bypass; and A3, turning off the main extraction system and the sealing extraction system.

* * * * *